United States Patent [19]
Yamazaki et al.

[11] Patent Number: 5,864,151
[45] Date of Patent: Jan. 26, 1999

[54] CMOS DEVICES COMPRISING THIN FILM TRANSISTORS ARRANGED ON A SUBSTRATE

[75] Inventors: Shunpei Yamazaki, Tokyo; Takeshi Fukunaga, Kanagawa, both of Japan

[73] Assignee: Semiconductor Energy Laboratory Co., Ltd., Kanagawa-ken, Japan

[21] Appl. No.: 795,257

[22] Filed: Feb. 10, 1997

[30] Foreign Application Priority Data

Feb. 9, 1996 [JP] Japan .................................... 8-048272

[51] Int. Cl.$^6$ .................................................. H01L 29/04
[52] U.S. Cl. .............................. 257/66; 257/69; 257/72; 257/350; 257/353
[58] Field of Search ................... 257/66, 69, 72, 257/350, 353; 438/162, 163

[56] References Cited

U.S. PATENT DOCUMENTS

| | | | |
|---|---|---|---|
| 4,621,276 | 11/1986 | Halhi | 257/66 |
| 5,710,606 | 1/1998 | Nakajima et al. | 349/42 |
| 5,712,495 | 1/1998 | Suzawa | 257/51 |

*Primary Examiner*—Valencia Wallace
*Attorney, Agent, or Firm*—Fish & Richardson P.C.

[57] ABSTRACT

In a circuit configuration comprising an n-channel thin-film transistor and a p-channel thin-film transistor integrally produced on a single substrate, a lightly-doped drain (LDD) region is formed selectively in the n-channel thin-film transistor, and damages to semiconductor layers caused when implanting impurity ions are balanced between the n- and p-channel thin-film transistors. This configuration achieves a balance between the n- and p-channel thin-film transistors and thereby provides high characteristics CMOS circuit.

12 Claims, 7 Drawing Sheets

FORMATION OF AMORPHOUS SILICON FILM 703, 702, 701

FORMATION OF WATER FILM CONTAINING NICKEL SALT

704

HEATING PROCESS FOR CRYSTALIZATION

705

HEATING PROCESS IN ATMOSPHERE CONTAINING HALOGEN ELEMENT 706, 707

708, 709

CMOS DEVICES COMPRISING THIN FILM TRANSISTORS ARRANGED ON A SUBSTRATE

BACKGROUND OF THE INVENTION

1. Technical Field of the Invention

The present invention relates to constructions and manufacturing methods of semiconductor devices in which a p-channel and n-channel thin-film transistors are arranged on a common substrate. More particularly, the invention is concerned with circuit configurations and manufacturing methods of complementary metal oxide semiconductor (CMOS) devices comprising thin-film transistors arranged on a glass substrate.

2. Description of the Related Art

In one conventionally known technique used for producing a thin-film transistor, a silicon layer is formed on a glass substrate and this silicon layer is used for manufacturing the thin-film transistor. This prior art technique has evolved mostly in the industry of manufacturing active matrix liquid crystal display devices.

Generally, a liquid crystal display is so constructed that liquid crystal is sandwiched between a pair of glass substrates. When voltages are applied across the liquid crystal layer which constitutes a large number of pixels arranged in a matrix form, optical properties of the liquid crystal are varied. As a result, the liquid crystal display presents a picture corresponding to the applied voltages.

An active matrix liquid crystal display is generally so constructed that thin-film transistors are provided in the aforementioned pixels which are arranged in a matrix form. These thin-film transistors control electric charges which are fed into and output from the individual pixels.

A common construction of the active matrix liquid crystal display today is such that a circuit (which is referred to as a peripheral driver circuit) for driving thin-film transistors arranged in a few hundred rows by a few hundred columns in an active matrix area is composed essentially of an integrated circuit (a driver IC) which is connected to the outside of a glass substrate using tape automated bonding (TAB) technology, for instance.

One problem of this construction, in which the driver IC is externally mounted to the outside of a glass substrate, is that it requires a complicated process for producing active matrix liquid crystal displays. For example, alignment of each driver IC and operational tests become complicated. Another problem is that a projecting portion is created on each active matrix liquid crystal display when the driver IC is externally mounted. This will impair potential multipurpose applicability of the active matrix liquid crystal displays in cases where they are to be assembled into various kinds of electronics apparatus.

An approach to the solution of the aforementioned problems is to integrally form a peripheral driver circuit itself with thin-film transistors directly on a glass substrate. This approach makes it possible to create an integrated device structure. Furthermore, it will provide such advantageous effects as simplification of manufacturing processes, increased reliability and greater applicability.

In an active matrix liquid crystal display having such an integrally formed peripheral driver circuit, a CMOS circuit is required to configure the peripheral driver circuit. The CMOS circuit is one of basic electronic circuits in which n- and p-channel transistors are joined together to form a complementary configuration.

An example of a conventional method of producing CMOS circuitry on a glass substrate is described with reference to FIGS. 4(A) to 4(D).

First, a silicon oxide film 402 which constitutes an underlying layer is grown on a glass substrate 401 as shown in FIG. 4(A). Then, active layers 403 and 404 which may either be crystalline or amorphous silicon layers are deposited on top of the silicon oxide film 402, and another silicon oxide film 405 which covers the active layers 403 and 404 and acts as a gate insulating layer is created. In FIG. 4(A), the active layer 403 is an islandlike region forming an active layer of an n-channel thin-film transistor while the active layer 404 is an islandlike region forming an active layer of a p-channel thin-film transistor.

Next, gate electrodes 406 and 407 composed of an electrically conductive material such as a silicide are formed as shown in FIG. 4(B), and phosphorus ions are implanted over the whole surface of the workpiece shown in FIG. 4(C). As a result, portions designated by the numerals 408, 410, 411 and 413 become n-type regions. The implantation of phosphorus ions is performed at a dose of $1\times10^{15}/cm^2$ to $2\times10^{15}/cm^2$ under conditions where a surface phosphorus ion density of $1\times10^{20}/cm^2$ or over is achieved.

Subsequently, a resist mask 414 is formed to selectively cover the n-channel thin-film transistor and boron ions are implanted as shown in FIG. 4(D) at a dose three to five times higher than the aforesaid dose of phosphorus ions. This causes the n-type regions 411 and 413 (FIG. 4(C)) to turn to the opposite conductivity type, or p-type. A source region 415, a drain region 416 and a channel region 412 of the p-channel thin-film transistor are created in a self-aligned manner. The reason why such a heavy doping level as described above is required is that the regions 415, 412 and 416 must form a p-i-p junction. In the construction of FIG. 4(D), the numerals 408, 409 and 410 designate a source region, a channel region and a drain region of the n-channel thin-film transistor, respectively.

In the aforementioned production method there is no need to form a resist mask in the processing step shown in FIG. 4(C). Although this is advantageous for simplifying production process, the production method has the following problems.

First, the implantation of impurity ions into the resist mask 414 at an extremely high doping level causes resist materials to vary in their properties, and this will result in an increase in the probability of occurrence of failures in the production process. More specifically, it may become impossible to remove the resist materials after doping, or the resist materials may partially be left after a photoresist removal process.

Second, the existence of an off current flowing through a junction between the channel region 412 and drain region 416 can not be disregarded. This is because the drain region 416 adjacent to the channel region 412 of the p-channel thin-film transistor shown at right in FIG. 4(D) is a region doped with an extremely high concentration of impurities, in which the impurity ions are added at a far higher doping level than what is normally required for producing a p-channel device, in order to invert the conductivity type.

Third, the boron ions implanted are inevitably added to the channel region 412 in part due to their undesirable migration. This phenomenon gives rise to a problem that essential electrical properties are not obtained at all, or such electrical properties are often unattainable.

Fourth, the implantation of the impurity ions at a high doping level which is needed in the processing step shown in FIG. 4(D) may overload an ion implanter or a plasma doping machine. This is likely to arise various problems due to contamination inside the equipment and its maintenance.

A fifth problem is that the need for the implantation of the impurity ions at a high doping level may lead to an increase in processing time.

A sixth problem could develop when annealing a product by using laser light. Generally, the resist mask 414 is removed after the processing step shown in FIG. 4(D) is finished, and then an annealing process, in which a laser beam is irradiated upon the product, is required in order to activate the dopant and to anneal the regions where the impurity ions have been implanted. (This method is effective when a glass substrate having low thermal resistance is used.) Since the regions 415 and 416 are doped with far larger amounts of impurity ions compared to the regions 408 and 410, remarkable damage occurs in the crystallinity of the former regions. Consequently, the dependence of optical absorbance on wavelength greatly differs between the two groups of regions: the regions 408 and 410, and the regions 415 and 416. In this situation, the effect of annealing by the laser light also differs considerably between the two groups of regions. This is not preferable because a large difference in electrical properties will occur between the n-channel thin-film transistor and p-channel thin-film transistor shown at left and right in FIG. 4(D), respectively.

SUMMARY OF THE INVENTION

It is a general object of the invention to provide a solution to the aforementioned problems which arise when n- and p-channel thin-film transistors are created at the same time by implanting impurity ions at a high doping level.

A more specific object of the invention is to compensate for adverse effects of a difference in electrical properties between the n- and p-channel thin-film transistors when configuring CMOS circuitry with thin-film transistors, and thereby provide a high-performance CMOS circuit.

According to the invention, a semiconductor device comprises an n-channel thin-film transistor (NTFT) and a p-channel thin-film transistor (PTFT) integrally produced on a single substrate, in which a lightly-doped drain (LDD) region is formed selectively in the n-channel thin-film transistor, a source region and a drain region of the p-channel thin-film transistor are doped with only those impurities which produce p-conductivity, and regions doped with impurities which produce n-conductivity and p-conductivity are formed adjacent to the source region and drain region of the p-channel thin-film transistor.

As will be later described in detail with reference to a specific embodiment. By way of example, in FIG. 3(B), a CMOS circuit is configured with an n-channel thin-film transistor located on the left side and a p-channel thin-film transistor located on the right side. In this CMOS circuit structure, a lightly-doped drain region 124 composed of a low dopant concentration region is provided just between a channel region and a drain region of only the left-hand n-channel thin-film transistor. The lightly-doped drain region serves to reduce off current and suppress deterioration by moderating a field strength applied between the channel region and drain region. It also serves to substantially decrease carrier mobility in a thin-film transistor by increasing the resistance between its source and drain.

When silicon is used as a semiconductor, a typical example of impurity for providing p-conductivity is phosphorus (P). A typical example of impurity for providing p-conductivity when using silicon as a semiconductor is boron (B).

The p-channel thin-film transistor of the above CMOS circuit structure in FIG. 3 is not provided with any particular buffering region like the lightly-doped drain region. There are, however, provided offset gate regions in the n- and/or p-channel thin-film transistor by using an insulating film produced on a side surface of each gate electrode. The offset gate regions exhibit similar effects to the lightly-doped drain region.

In the later-described embodiment, in FIG. 1(E), anodic oxide films 114 and 115 act as a mask when impurity ions are implanted, and offset gate regions having a width approximately equal to the thickness of the anodic oxide films, as measured at side surfaces of the gate electrode, are produced. These offset gate regions do not function as effective offset gate regions, however, if their width is too small.

Other important features of the semiconductor device of the invention are as follows. In a process shown as FIG. 1(E), regions 128 and 130 undoped in a phosphorus ion doping process as they are masked by the anodic oxide films 112 and 113 are doped with boron ions in a later doping process of FIG. 2(C) (referred as FIG. 3(B)). Accordingly, these regions contain only such impurities that produce p-conductivity. The inventors refer to these regions 128 and 130, respectively, in the p-channel thin-film transistor as source and drain regions.

To add, regions 127 and 131 adjacent to the source and drain regions 128, 130 are doped with phosphorus ions in the aforementioned phosphorus ion doping process of FIG. 1(E). Accordingly, these regions contain both types of impurities that produce n-conductivity and p-conductivity. The inventors clearly discriminate these regions 127 and 131 from the source region 128 and drain region 130 and refer to them as contact pads because they act only as connecting electrodes that make electrical contact to the source and drain regions.

The semiconductor device of the invention is therefore characterized in that the source region and drain region of the p-channel thin-film transistor are individually sandwiched between one of the regions doped with the impurities which produce n-conductivity and p-conductivity and a channel region.

If the channel region of the n- and/or p-channel thin-film transistors is doped with impurities that produce a single conductivity type, it becomes possible to effectively control threshold voltage, which is one of important electrical properties of thin-film transistors. This is achieved by adding boron ions that produces p-conductivity to the channel region of the n-channel thin-film transistor and phosphorus ions that produces n-conductivity to the channel region of the p-channel thin-film transistor, for instance.

In a varied form of the invention, a semiconductor device comprises an n-channel thin-film transistor and a p-channel thin-film transistor integrally produced on a single substrate, in which an offset gate region is formed in the n-channel thin-film transistor, the offset gate region having a larger width than an offset gate region formed in the p-channel thin-film transistor, a source region and a drain region of the p-channel thin-film transistor are doped with only those impurities which produce p-conductivity, and regions doped with impurities which produce n-conductivity and p-conductivity are formed adjacent to the source region and drain region of the p-channel thin-film transistor.

In another varied form of the invention, a semiconductor device comprises an active matrix area containing n-channel thin-film transistors arranged in a matrix form and a peripheral driver circuit for driving the n-channel thin-film transistors of the active matrix area, the active matrix area and the peripheral driver circuit being produced on a single substrate, in which the peripheral driver circuit incorporates a circuit including n- and p-channel thin-film transistors which are interconnected to form a complementary configuration, a lightly-doped drain region and/or an offset gate region is formed selectively in each n-channel thin-film transistor of the peripheral driver circuit, a source region and a drain region of each p-channel thin-film transistor of the peripheral driver circuit are doped with only those impurities which produce p-conductivity, and regions doped with impurities which produce n-conductivity and p-conductivity are formed adjacent to the source region and drain region.

In still another varied form of the invention, a semiconductor device comprises an active matrix area containing p-channel thin-film transistors arranged in a matrix form and a peripheral driver circuit for driving the p-channel thin-film transistors of the active matrix area, the active matrix area and the peripheral driver circuit being produced on a single substrate, in which the peripheral driver circuit incorporates a circuit including n- and p-channel thin-film transistors which are interconnected to form a complementary configuration, a lightly-doped drain region and/or an offset gate region is formed selectively in each n-channel thin-film transistor of the peripheral driver circuit, a source region and a drain region of each p-channel thin-film transistor of the active matrix area and peripheral driver circuit are doped with only those impurities which produce p-conductivity, and regions doped with impurities which produce n-conductivity and p-conductivity are formed adjacent to the source region and drain region.

According to the invention, a method of manufacturing a semiconductor device in which an n-channel thin-film transistor and a p-channel thin-film transistor are integrally produced on a single substrate comprises a first process of selectively forming anodic oxide films having a porous structure on side surfaces of gate electrodes composed of a material that can be anodized, a second process of adding impurities which produce n-conductivity using the anodic oxide films as a mask, a third process of removing the anodic oxide films, a fourth process of selectively masking an area where the p-channel thin-film transistor is produced with a photoresist, a fifth process of adding impurities which produce n-conductivity using the gate electrodes and the photoresist applied in the fourth process as a mask to form lightly-doped drain regions beneath areas where the anodic oxide films existed, a sixth process of removing the photoresist applied in the fourth process, a seventh process of selectively masking an area where the n-channel thin-film transistor is produced with a photoresist, and an eighth process of adding impurities which produce p-conductivity using the gate electrodes and the photoresist applied in the seventh process as a mask, wherein regions doped with only the impurities which produce p-conductivity are formed in the eighth process beneath areas where the anodic oxide films existed, while regions doped with the impurities which produce n-conductivity and p-conductivity are formed adjacent to the regions doped with only the impurities which produce p-conductivity.

The impurities for producing either n-conductivity or p-conductivity are added by injecting accelerated impurity ions through a gate insulating layer in the aforementioned second, fifth and eighth processes. This serves of reduce damages to active layers of the thin-film transistors.

Another method of manufacturing a semiconductor device in which an n-channel thin-film transistor and a p-channel thin-film transistor are integrally produced on a single substrate comprises a first process of selectively forming anodic oxide films having a porous structure on side surfaces of gate electrodes composed of a material that can be anodized, a second process of adding impurities which produce n-conductivity using the anodic oxide films as a mask, a third process of removing the anodic oxide films, a fourth process of selectively masking an area where the n-channel thin-film transistor is produced with a photoresist, and a fifth process of adding impurities which produce p-conductivity using the gate electrodes and the photoresist as a mask, wherein an offset gate region having a width determined by the anodic oxide films having the porous structure is selectively formed in the n-channel thin-film transistor in the second process.

What is characteristic of the above construction as it is applied to one specific embodiment shown as FIG. 5 is that a physical dimension of offset gate regions 515 and 517 is determined by the width of an anodic oxide film 505 having a porous structure. If another anodic oxide film 500 of a fine and dense structure has a large thickness, it will also contribute to the formation of the offset gate regions 515 and 517.

In one modified method of manufacturing a crystalline silicon film, the crystalline silicon film used for making active layers of the n- and p-channel thin-film transistors is produced by a process comprising a first step of forming a metallic element for accelerating crystallization on an amorphous silicon film, a second step of converting the amorphous silicon film into a crystalline silicon film by heat treatment, a third step of forming a thermal oxide layer on top of the crystalline silicon film by heating it in an atmosphere containing a halogen element, and a fourth step of removing the thermal oxide layer, wherein the metallic element remaining in the crystalline silicon film is absorbed into the thermal oxide layer by gettering operation performed in the third step.

Preferably, the aforementioned second step is performed within a temperature range of 500° to 700° C. and the third step is performed within a temperature range of 700° to 1200° C.

The present invention is described in detail in the embodiments 1 to 10 as follows.

DETAILED DESCRIPTION OF THE PREFERRED EMBODIMENTS

First Embodiment

FIGS. 1(A)–1(E), 2(A)–2(D) and 3(A)–3(B) illustrate processing steps for the production of a thin-film transistor according to a first embodiment, in which a CMOS structure is configured with thin-film transistors created on a glass substrate.

Figure 1A:
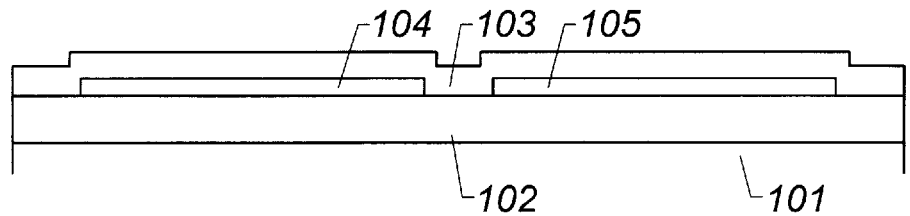
FIGS. 1(A)–1(E) are diagrams illustrating processing steps for the production of a thin-film transistor circuit having a CMOS structure according to a first embodiment.

First, a silicon oxide film 102 which constitutes an underlying layer is formed on a glass substrate 101 as shown in FIG. 1(A). The silicon oxide film 102 may be grown to a thickness of about 3000 Å by using an appropriate technique, such as a sputtering method or a plasma chemical vapor deposition (CVD) method. Corning 7059 or Corning 1737 glass plate can be used as the glass substrate 101, for instance. Alternatively, a quartz substrate having higher thermal resistance may be used as a light-transmitting substrate although it is more expensive.

After the formation of the silicon oxide film 102, a thin film of silicon from which active layers of a thin-film transistor are produced in a later stage is produced. In this embodiment, an amorphous silicon film (not shown) which serves as a starting layer is grown to a thickness of 500 Å at first. Either the plasma CVD method or low-pressure thermal CVD method may be employed for producing the amorphous silicon film.

When the unillustrated amorphous silicon film has been formed, it is converted into a crystalline silicon film (not shown). This is achieved by exposing the amorphous silicon film to laser light or through a heating process, or a combination of laser light exposure and heating process. During this crystallization process, means for forming a metallic element which accelerates crystallization on the surface of the amorphous silicon film may be employed. Details of this crystallization means are described by the inventors in Japanese Unexamined Patent Publications No. 6-232059 and No. 6-244103.

The unillustrated crystalline silicon film thus obtained is then patterned to form a semiconductor layer 104 of an n-channel thin-film transistor and a semiconductor layer 105 of a p-channel thin-film transistor as shown in FIG. 1(A).

Next, another silicon oxide film 103 which will serve as a gate insulating layer is deposited to a thickness between 500 Å and 2000 Å (typically between 1000 Å and 1500 Å) by the plasma CVD method. As an alternative, the gate insulating layer may be formed by a silicon oxide-nitride film, a silicon nitride film, or other insulating films.

At this point, a structure shown in FIG. 1(A) is obtained. For the sake of simplification, the present embodiment is described, by way of example, as comprising a single set of n- and p-channel thin-film transistors. In general, however, that a thin-film transistor circuit employed in an active matrix liquid crystal display typically contains a few hundred or more sets of n- and p-channel thin-film transistors formed on a glass substrate.

Figure 1B:
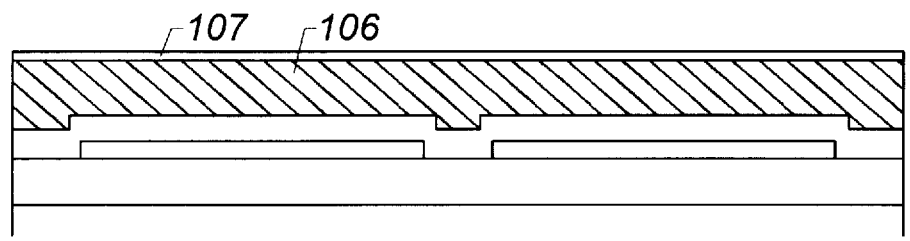

Referring to FIG. 1(B), an aluminum film 106 which will later constitute gate electrodes 11 and 12 is deposited. This aluminum film 106 contains 0.2% by weight of scandium for preventing formation of hillocks and whiskers. The aluminum film 106 may be formed by the sputtering method or electron-beam evaporation method. The hillocks and whiskers are spinelike and needlelike protuberances, respectively, that are formed as a result of abnormal growth of aluminum. The presence of hillocks and whiskers can cause short circuits or crosstalk between adjacent wirings or between vertically separated nearby wirings. In a varied form of the embodiment, tantalum or other metals that can be anodized may be used instead of aluminum.

When the aluminum film 106 has been formed, its surface is anodized in an electrolytic solution, in which the aluminum film 106 is used as an anode. A thin anodic oxide film 107 having a fine and dense structure is formed in this anodic oxidization process. The electrolytic solution used in this embodiment is made by neutralizing an ethylene glycol solution containing 3% of tartaric acid with ammonia. The anodic oxidization process is advantageous in that an anodic oxidization having a fine chemical structure is obtained and its thickness can be adjusted by controlling the applied voltage. In this embodiment, the thickness of the anodic oxide film 107 is set to about 100 Å. The anodic oxide film 107 serves to improve adherence to a resist mask which will be formed in a succeeding processing step shown in FIG. 1(B).

Figure 1C:
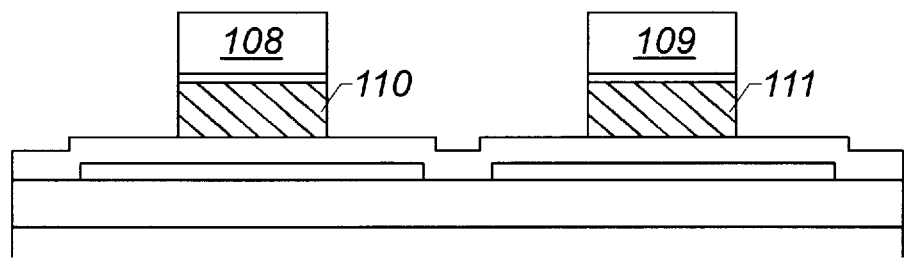

The resist masks 108 and 109 are formed after the structure has been obtained. Then, both the aluminum film 106 and the anodic oxide film 107 are patterned using the resist masks 108 and 109, obtaining patterns 110 and 111 as shown in FIG. 1(C).

The patterns 110 and 111 which are the remainder of the aluminum film 106 are subjected to anodic oxidization in an electrolyte, that is, a 3% solution of oxalic acid, in which the patterns 110 and 111 serve as anodes. In this anodic oxidization process, side surfaces of the patterns 110 and 111 are selectively anodized because remaining portions of the anodic oxide film 107 having the fine and dense structure and the resist masks 108 and 109 still exist on top of the patterns 110 and 111. The consequence of the anodic oxidization process is formation of anodic oxide films 112 and 113 having a porous structure. These anodic oxide films 112 and 113 can be grown to a thickness of about a few micrometers.

In this embodiment, the thickness of the anodic oxide films 112 and 113 is set to about 7000 Å. The depth of anodization determines a physical dimension of a low dopant concentration region which will be described later. It is known from experience that these porous anodic oxide films 112 and 113 should preferably be grown to a thickness of 6000 to 8000 Å. Their thickness can be controlled by adjusting the period of anodizing time.

The above-mentioned gate electrodes 11 and 12 have been formed at this point. When the structure shown in FIG. 1(D) has been obtained, the resist masks 108 and 109 are removed.

Figure 1D:
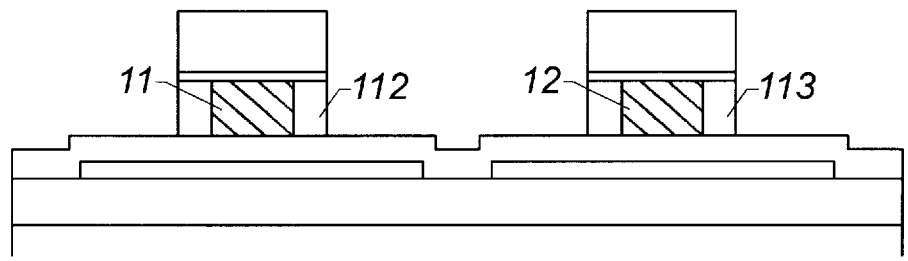
Figure 1E:
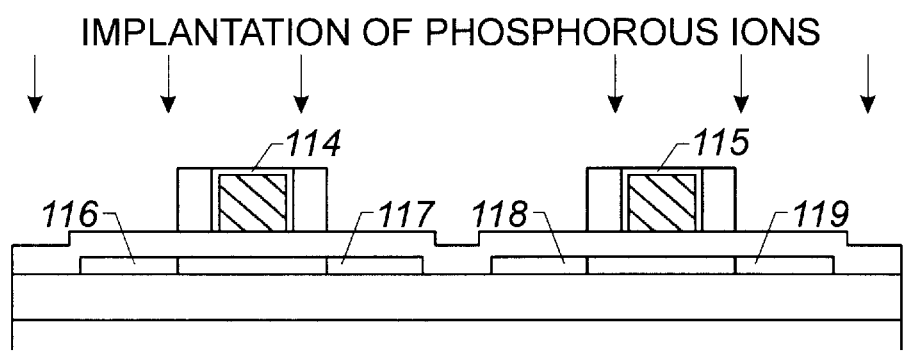

The surface of the workpiece shown in FIG. 1(D) is anodized using again an electrolytic solution made by neutralizing an ethylene glycol solution containing 3% of tartaric acid with ammonia. During this anodic oxidization process, the electrolytic solution permeates the porous anodic oxide films 112 and 113. As a result, anodic oxide films having a fine and dense structure that are designated by the numerals 114 and 115 in FIG. 1(E) are produced. The thickness of the anodic oxide films 114 and 115 is set to 500 to 4000 Å, and their thickness is controlled by adjusting the period of time during which a voltage is applied. The remaining portions of the earlier-mentioned anodic oxide film 107 are absorbed, or merged, into the anodic oxide films 114 and 115.

Next, the whole surface of the workpiece shown in FIG. 1(E) is doped with phosphorus ions which give n-conductivity. This doping process is performed at a high dose of $0.2 \times 10^{15}/cm^2$ to $5 \times 10^{15}/cm^2$, and more preferably $1 \times 10^{15}/cm^2$ to $2 \times 10^{15}/cm^2$, by a plasma doping method or an ion doping method.

Regions 116 to 119 in which phosphorus ions are implanted at a high concentration level are produced through the doping process depicted in FIG. 1(E).

The anodic oxide films 112 and 113 having the porous structure are then removed by using aluminum-mixed acid. Active regions located immediately beneath the anodic oxide films 112 and 113 are substantially intrinsic because those regions are not implanted with any ions.

Figure 2A:
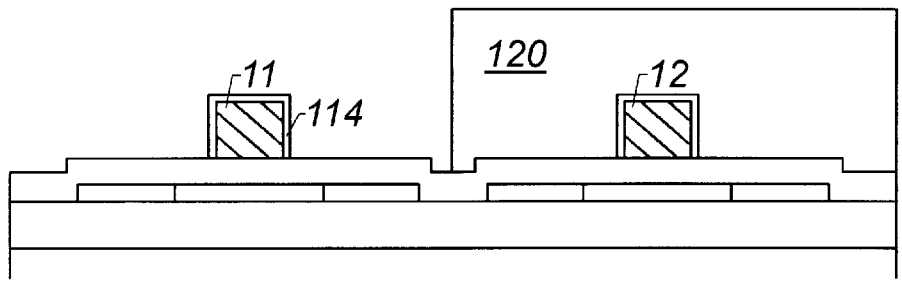
FIGS. 2(A)–2(D) are diagrams illustrating processing steps that follow the steps of FIGS. 1(A)–1(E) for the production of the thin-film transistor circuit having the CMOS structure according to the first embodiment.
Figure 2B:
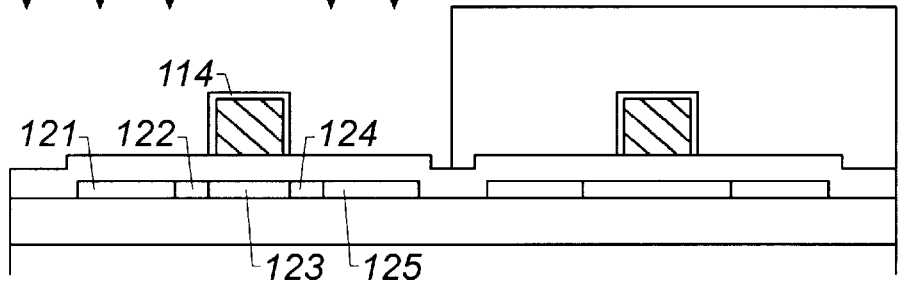

Subsequently, a resist mask 120 is formed to cover device elements that constitute the p-channel thin-film transistor as shown in FIG. 2(A), and phosphorus ions are implanted again as shown in FIG. 2(B) at such a low dose of $0.1 \times 10^{14}/cm^2$ to $5 \times 10^{14}/cm^2$, and more preferably $0.3 \times 10^{14}/cm^2$ to $1 \times 10^{14}/cm^2$. This means that the implantation of phosphorus ions shown in FIG. 2(B) is performed at a lower doping level than that shown in FIG. 1(E). As a result, regions 122 and 124 become low dopant concentration regions which have been lightly doped with phosphorus ions whereas regions 121 and 125 become high dopant concentration regions which have been more heavily doped with phosphorus ions.

Through the doping process depicted in FIG. 2(B), the region 121 becomes a source region of the n-channel thin-film transistor, the regions 122 and 124 become low dopant concentration regions, and the region 125 becomes a drain region of the n-channel thin-film transistor. Further, a region designated by the numeral 123 becomes a channel region which is substantially intrinsic. It is to be noted that the region 124 is generally known as a lightly-doped drain (LDD).

Although not illustrated, there exists regions where the implantation of phosphorus ions has been interrupted by the anodic oxide film 114 just between the channel region 123 and the low dopant concentration regions 122 and 124. These regions are referred as offset gate regions and have a thickness equal to that of the anodic oxide film 114. The offset gate regions are substantially intrinsic since they are not implanted with any ions. However, the offset gate regions do not form conducting channels but serve to alleviate applied electric field strengths and act as resistive elements which suppress circuit deterioration because no gate voltage is applied (not completely but may be so regarded practically). It is to be pointed out, however, that if the width of the offset gate regions is too small, they do not function as effective offset gate regions.

Figure 2C:
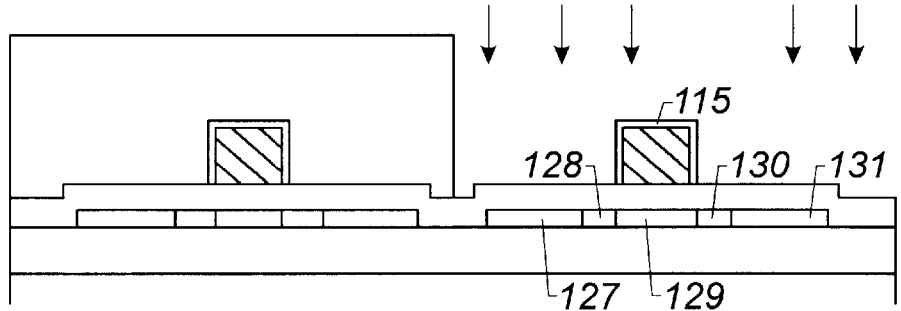

Next, the resist mask 120 is removed and another resist mask 126 is formed to cover device elements that constitute the n-channel thin-film transistor as shown in FIG. 2(C). Then, boron ions are implanted as shown in FIG. 2(C) at a dose of $0.2 \times 10^{15}/cm^2$ to $1 \times 10^{15}/cm^2$, and more preferably $1 \times 10^{15}/cm^2$ to $2 \times 10^{15}/cm^2$. The dose of boron ions in FIG. 2(C) is higher than that of phosphorus ions in FIG. 1(E).

Regions designated by the numerals 127 and 131 that are produced in the doping process of FIG. 2(C) act as pads for making electrical contact to lead-out electrodes in practice. (These regions are hereinafter referred to as contact pads.) More specifically, the regions 127 and 131 are clearly distinguished from either a source or drain region unlike the case with the n-channel thin-film transistor shown at left in FIG. FIG. 2(C).

Designated by the numeral 128 is a source region and designated by the numeral 130 is a drain region of the p-channel thin-film transistor shown at right in FIG. 2(C). These regions 128 and 130 are formed by implanting only the boron ions into those regions which have been substantially intrinsic. Accordingly, other types of ions do not exist in these regions and this means that it is easy to control dopant concentrations and create good p-i junctions. Moreover, degradation in the crystallinity of these regions due to ion implantation is relatively small.

Although offset gate regions are created by the anodic oxide film 115 in a self-aligned manner, their presence in the p-channel thin-film transistor is not of much importance in actuality. This is because the p-channel thin-film transistor is known to be almost impervious to degradation problems from experience.

The source region 128 and drain region 130 of the p-channel thin-film transistor are formed in a self-aligned manner as seen above. A region designated by the numeral 129 is not implanted with an impurity and forms a channel region. As already stated, the regions 127 and 131 are the contact pads for drawing electric currents from the source region 128 and drain region 130, respectively.

Although the channel regions 123 and 129 are not implanted with any impurity in the present embodiment, the above-described structure may be varied in such a way that the channel regions 123 and 129 are intentionally doped with impurities to provide them with a particular conductivity type for controlling threshold voltage.

Figure 2D:
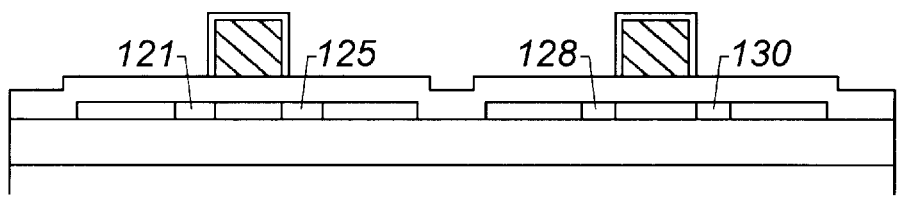

Upon completion of the doping process depicted in FIG. 2(C), the resist mask 126 is removed to obtain a structure depicted in FIG. 2(D). The whole surface of the workpiece shown in FIG. 2(D) is exposed to laser light in order to activate the dopant and to anneal the regions where the impurity ions have been implanted. In this processing step, exposure to the laser light can be performed in a condition where there is not a large difference in crystallinity between the source and drain regions 121, 125 of the n-channel thin-film transistor and the source and drain regions 128, 130 of the p-channel thin-film transistor. The reason why the difference in crystallinity is not large is that crystalline structures of the source and drain regions 128, 130 of the p-channel thin-film transistor are not so damaged during the doping process of FIG. 2(C).

It is therefore possible to revise the difference in annealing effects between the two thin-film transistors when their source and drain regions are annealed by the exposure to the laser light in FIG. 2(D). In other words, the difference in electrical properties of the n- and p-channel thin-film transistors can be canceled out.

Figure 3A:
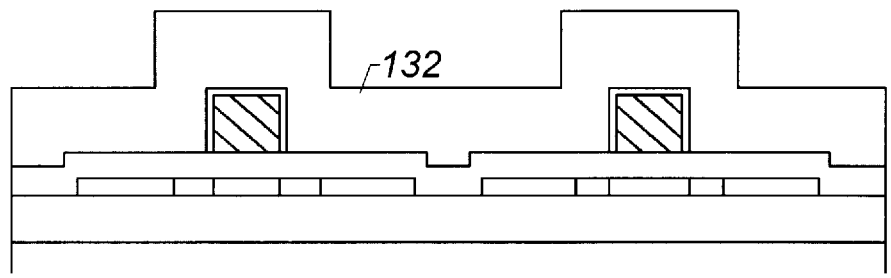
FIGS. 3(A) and 3(B) are diagrams illustrating processing steps that follow the steps of FIGS. 2(A)–2(D) for the production of the thin-film transistor circuit having the CMOS structure according to the first embodiment.

When the structure shown in FIG. 2(D) has been obtained, an interlayer insulating film 132 is grown to a thickness of 4000 Å as illustrated in FIG. 3(A). The interlayer insulating film 132 may be a film of silicon oxide, silicon oxide-nitride, silicon nitride, or of a multilayer structure. Whichever type of silicide insulating material is used, the interlayer insulating film 132 can be produced by the plasma CVD method or thermal CVD method.

Now, contact holes are formed and then a source electrode 133 and a drain electrode 134 of the n-channel thin-film transistor are produced. Also produced at the same time are a source electrode 135 and a drain electrode 136 of the p-channel thin-film transistor. At this point, a structure as shown in FIG. 3(B) is obtained.

The workpiece is patterned to make a connection between the drain electrode 134 of the n-channel thin-film transistor and the drain electrode 136 of the p-channel thin-film transistor, and the gate electrodes 11 and 12 of the two thin-film transistors are interconnected to complete the CMOS structure.

Figure 3B:
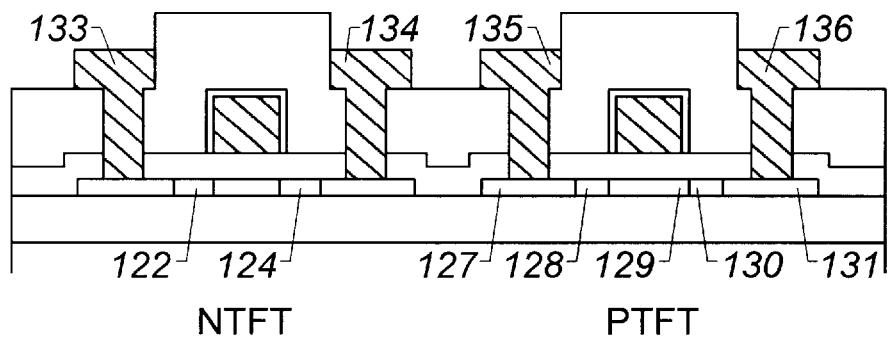
Figure 4A:
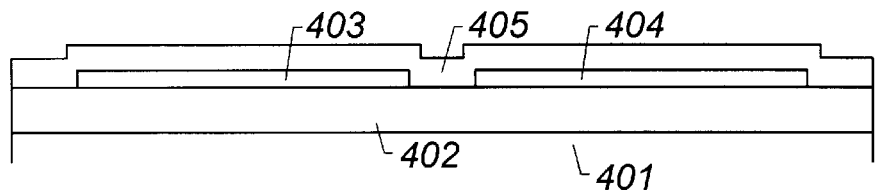
FIGS. 4(A)–4(D) are diagrams illustrating processing steps for the production of a thin-film transistor circuit having a conventional CMOS structure.
Figure 4B:
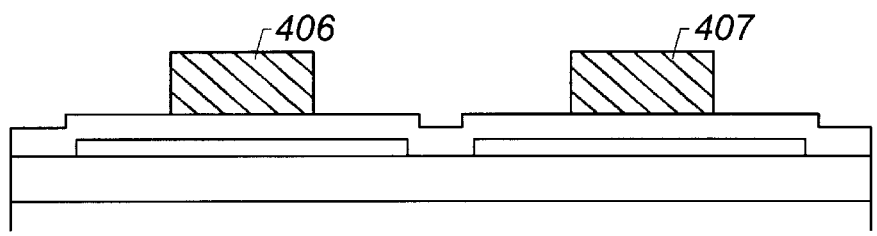
Figure 4C:
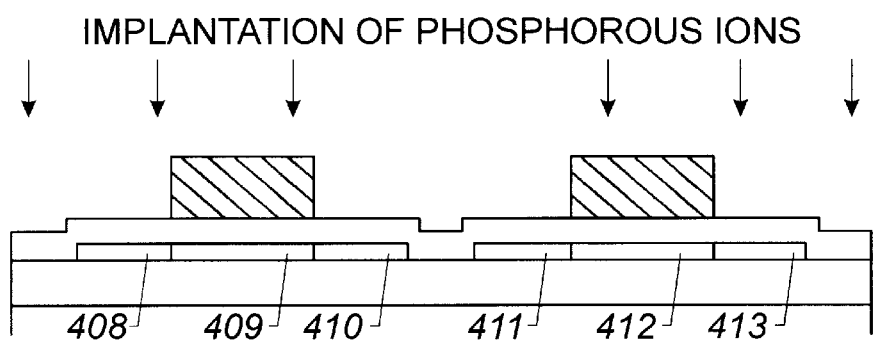
Figure 4D:
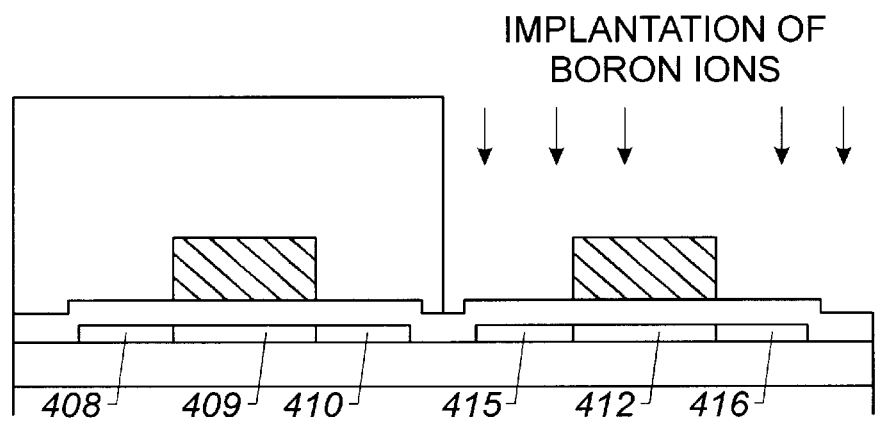

It is seen from FIG. 3(B) that the low dopant concentration regions 122 and 124 are arranged in the n-channel thin-film transistor in this CMOS structure.

The low dopant concentration regions 122 and 124 have the following effects:

Reduce off current;

Prevent degradation of the thin-film transistors by hot carriers; and

Increase the resistance between source and drain and thereby decrease carrier mobility in the n-channel thin-film transistor.

A common problem encountered when the CMOS structure as shown in FIG. 3(B) is employed is that a difference in electrical properties between n- and p-channel thin-film transistors causes adverse effects. In cases where crystalline silicon films are used as discussed in the above embodiment, the carrier mobility ranges from 100 to 150 Vs/cm$^2$ in the n-channel thin-film transistor; however, the carrier mobility generally attainable in the p-channel thin-film transistor is from 30 to 80 Vs/cm$^2$. Further, the n-channel thin-film transistor is subject to degradation caused by hot carriers, although this problem is of no importance in the p-channel thin-film transistor. In general, there is no particular requirement concerning low off current characteristics in a CMOS circuit.

Under these conditions, the aforementioned embodiment offers such advantages as described below by employing the CMOS structure in which the n-channel thin-film transistor includes the low dopant concentration regions 122 and 124. Specifically, the CMOS structure of the embodiment achieves an overall balance in electrical properties between the n- and p-channel thin-film transistors by decreasing the carrier mobility in the n-channel thin-film transistor and preventing its degradation, and thereby improves the performance characteristics of the CMOS circuit.

Also important in this CMOS structure is that the semiconductor layers are covered with the silicon oxide film 103 which constitutes the gate insulating layer in the implanting processes shown in FIGS. 1(E), 2(B) and 2(C). It is possible to protect the surface of the semiconductor layers from damages and contamination if impurity ions are implanted in this condition. This contributes significantly to the improvement in production yield and device reliability.

It is also to be pointed out that the impurity ions are not implanted at an extremely high doping level in any processing step in the aforementioned embodiment. This serves to prevent changes in the properties of masking photoresist and reduce the probability of occurrences of processing defects resulting from such property changes.

Second Embodiment

A second embodiment of the invention provides a thin-film transistor CMOS structure in which offset gate regions are created only in an n-channel thin-film transistor. Unlike the offset gate regions described in the first embodiment, the offset gate regions of this embodiment are formed from an anodic oxide film having a porous structure. (In the first embodiment, the offset gate regions are produced by using the finally remaining anodic oxide films having a fine and dense structure.)

Like low dopant concentration regions, of which typical example is an LDD region, offset gate regions generally have the following effects:

Reduces off current;

Increases the resistance between source and drain and thereby decreases carrier mobility in the n-channel thin-film transistor; and Prevents degradation of the n-channel thin-film transistor by hot carriers.

Figure 5A:
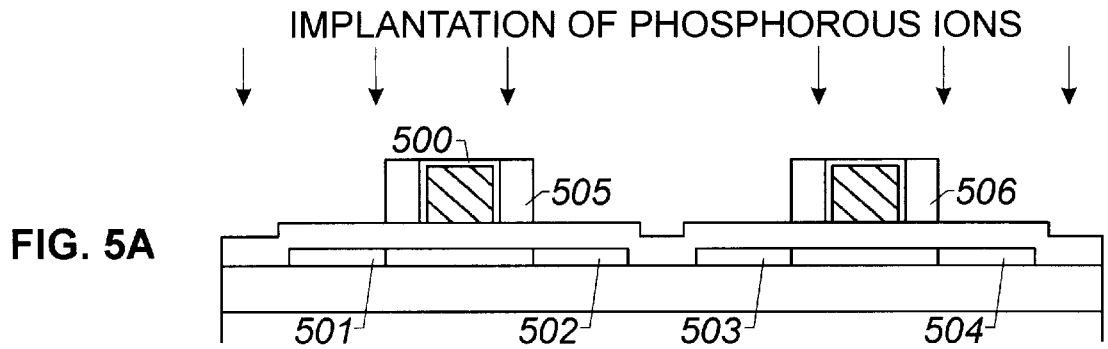
FIGS. 5(A)–5(D) are diagrams illustrating processing steps for the production of a thin-film transistor circuit having a CMOS structure according to a second embodiment.

FIGS. 5(A)–5(D) illustrate processing steps for the production of a thin-film transistor circuit having the CMOS structure of the second embodiment. First, a workpiece as shown in FIG. 5(A) is prepared by following the same processing steps as shown in FIGS. 1(A)–1(E).

Referring to FIG. 5(A), the numeral 500 designates an anodic oxide film having a fine and dense structure that is formed around a gate electrode. The thickness of this anodic oxide film 500 may be set within a range of 500 to 4000 Å. In this embodiment, the anodic oxide film 500 is made 600 Å thick.

Porous anodic oxide films designated by the numerals 505 and 506 in FIG. 5(A) are set to a thickness of 2000 to 4000 Å. The thickness of the anodic oxide film 505 determines an approximate physical dimension of the offset gate regions which will be produced in a later stage. Although the thickness of the anodic oxide film 500 having the fine and dense structure surrounded by the anodic oxide film 505 also affects the physical dimension of the offset gate regions in the strict sense as previously discussed in the first embodiment, the presence of the anodic oxide film 500 is disregarded here since its thickness is only about 600 Å.

At this point, phosphorus ions are implanted at a such high dose of $0.2 \times 10^{15}$/cm$^2$ to $5 \times 10^{15}$/cm$^2$, and more preferably $1 \times 10^{15}$/cm$^2$ to $2 \times 10^{15}$/cm$^2$, by the plasma doping method or ion doping method. With this doping level, the phosphorus ions are heavily implanted into regions 501 to 504. This means that the regions 501 to 504 form high dopant concentration regions.

Figure 5B:
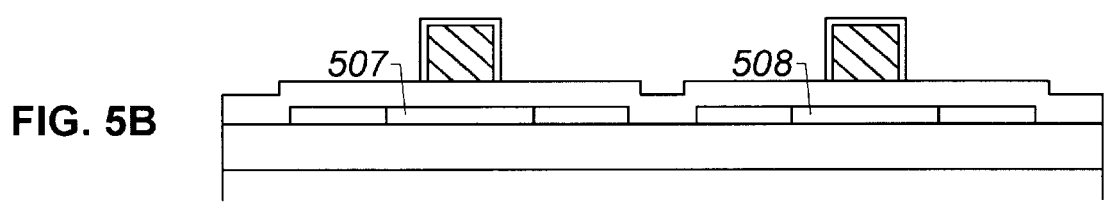

The porous anodic oxide films 505 and 506 are then removed to obtain a structure as shown in FIG. 5(B), in which, designated by the numerals 507 and 508 are regions which have not been doped with the phosphorus ions.

Figure 5C:
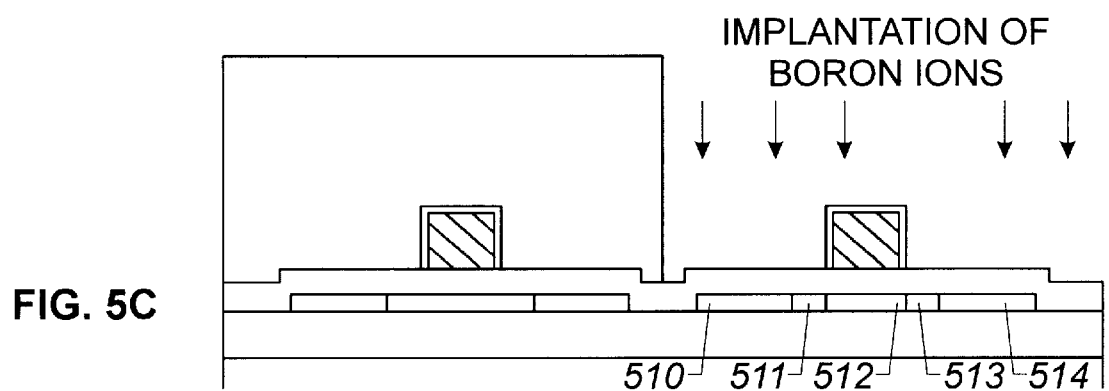

Next, a resist mask 509 is formed to cover the n-channel thin-film transistor, and boron ions are implanted as shown in FIG. 5(C). This doping process is performed at a dose of $0.2 \times 10^{15}$/cm$^2$ to $1 \times 10^{15}$/cm$^2$, and more preferably $1 \times 10^{15}$/cm$^2$ to $2 \times 10^{15}$/cm$^2$, by the plasma doping method or ion doping method.

As a result of the above doping process, regions designated by the numerals 510, 511, 513 and 514 form p-type regions whereas a region designated by the numeral 512 forms a substantially intrinsic channel region. Similar to what has been described in relation to the first embodiment, the region 511 acts as a source region, the region 513 acts as a drain region, and the regions 510 and 514 act as contact pads for making electrical contact to the source region 511 and drain region 513, respectively. Since both the source region 511 and drain region 513 are substantially intrinsic regions before they are doped with boron ions, these regions can easily be converted to p-type regions by the implantation of boron ions in the process of FIG. 5(C). It is therefore possible to choose a minimum dose of boron ions in this doping process.

The source region 511, channel region 512, drain region 513 and contact pads 510 and 514 of a p-channel thin-film transistor are formed in a self-aligned manner as seen above.

Figure 5D:
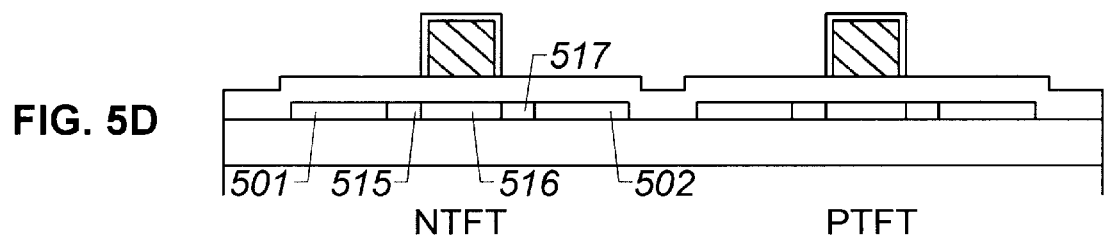

The resist mask 509 is then removed to obtain a structure as shown in FIG. 5(D), in which designated by the numeral 501 is a source region, designated by the numeral 502 is a drain region, and designated by the numeral 516 is a channel region of the n-channel thin-film transistor. Further, designated by the numerals 515 and 517 are regions which constitute the earlier-mentioned offset gate regions. The offset gate regions 515 and 517 are not subjected to an electric field from the gate electrode, and neither do they act as source or drain regions. These regions 515 and 517 serve to moderate the electric field strengths between the source region 501 and channel region 516, and especially between the drain region 502 and channel region 516, respectively. These offset gate regions 515 and 517 are formed in a self-aligned manner by use of the anodic oxide film 505 which has a porous structure.

On the other hand, there exists no offset gate region in the p-channel thin-film transistor. (Although offset gate regions are produced by a finally remaining anodic oxide film having a fine and dense structure in the strict sense, the presence of the offset gate regions in the p-channel thin-film transistor is disregarded here since their physical dimensions are so small.)

As described in relation to the first embodiment, the aforementioned structure of the second embodiment practically decreases the carrier mobility in the n-channel thin-film transistor, prevents deterioration of its performance characteristics, and thereby achieves an improved balance between the n- and p-channel thin-film transistors Third Embodiment A third embodiment of the invention is a varied form of the first embodiment. Specifically, the doping process of FIG. 2(B), in which phosphorus ions are implanted, and the doping process of FIG. 2(C), in which boron ions are implanted, are performed in reverse order. It is to be appreciated, however, that the third embodiment produces the same advantages as the first embodiment, and this means that phosphorus ion and boron ion concentrations can be controlled independently of each other.

Fourth Embodiment

A fourth embodiment of the invention is another varied form of the first embodiment. Specifically, the doping process of FIG. 1(E), in which phosphorus ions are implanted at a high dose (heavy doping), and the doping process of FIG. 2(B), in which phosphorus ions are implanted at a low dose (light doping), are replaced with each other.

FIGS. 1(A)–1(E), 2(A)–2(D) and 3(A)–3(B) are used in the following description of the fourth embodiment, wherein elements equivalent or similar to those of the first embodiment are designated by the same reference numerals.

When the structure shown in FIG. 1(E) has been obtained following the same processing steps as the first embodiment, phosphorus ions are implanted. This doping process is however performed in the same light doping condition as illustrated in FIG. 2(B) of the first embodiment, and consequently regions 116 to 119 produced in this process by implanting the phosphorus ions have a lower dopant concentration compared to those described in the first embodiment.

A resist mask 120 is formed to cover device elements that will constitute a p-channel thin-film transistor in the same way as shown in FIG. 2(A), and then phosphorus ions are implanted again as shown in FIG. 2(B). In this case, however, the doping process is performed in the same heavy doping condition as illustrated in FIG. 1(E) of the first embodiment. Consequently, regions 122 and 124 produced in this process have a higher dopant concentration than those described in the first embodiment.

Subsequently, n- and p-channel thin-film transistors are produced in the same way as the first embodiment.

According to this embodiment, semiconductor layers 104 and 105 of the n- and p-channel thin-film transistors receive equal damages from ion implantation because the heavy doping process is performed after the light doping process. This means that it is possible to cancel out the difference in annealing effects between the two thin-film transistors when their source and drain regions are annealed by exposure to laser light in the same condition as shown in FIG. 2(D). In other words, the difference in electrical properties between the n- and p-channel thin-film transistors can be revised in the fourth embodiment.

In addition, the dopant concentration in the LDD region 124 of the n-channel thin-film transistor of this embodiment is different from that of the first embodiment. Since the impurity ions are implanted at a higher doping level in this embodiment than in the first embodiment, the LDD region 124 has reduced resistance. Therefore, the fourth embodiment provides a CMOS structure that is advantageous when on current characteristics are of great importance.

Fifth Embodiment

A fifth embodiment of the invention is directed to a structure, in which a channel region of an n-channel thin-film transistor is given slightly p-conductivity in order to obtain a desired threshold voltage of the n-channel thin-film transistor.

Processing steps of this embodiment are basically same as those of the first embodiment which is illustrated in FIGS. 1(A)–1(E), 2(A)–2(D) and 3(A)–3(B). What is characteristic of the fifth embodiment, in comparison with the first embodiment, is that a small amount of diborane ($B_2H_6$) is added when growing an amorphous silicon film which serves as a starting layer for producing semiconductor layers 104 and 105. The actual amount of diborane should be determined in consideration of a desired threshold level of the n-channel thin-film transistor. More specifically, the amount of diborane to be added is determined so that the concentration of boron element eventually left in the channel region would fall within a range of approximately $1 \times 10^{17}/cm^2$ to $5 \times 10^{17}/cm^2$.

This embodiment is advantageous in that the threshold voltage can be intentionally adjusted by the addition of a small amount of diborane.

Sixth Embodiment

The fifth embodiment described above provide the structure, in which the channel region of the n-channel thin-film transistor is given slightly p-conductivity to obtain a desired threshold voltage. In the structure of the third embodiment, however, it is not possible to freely control the threshold level of the p-channel thin-film transistor.

To solve this problem, impurity ions are selectively injected into a semiconductor layer 104 and/or a semiconductor layer 105 in a condition shown in FIG. 1(A) or before a gate insulating layer 103 is produced prior to the condition of FIG. 1(A) in this embodiment.

As an example, the semiconductor layer 105 is masked before producing the gate insulating layer 103 and then boron ions are implanted into the semiconductor layer 104 at a specified doping level to turn the semiconductor layer 104 into a slightly p-type region. Subsequently, the semiconductor layer 104 is masked and phosphorus ions are implanted into the semiconductor layer 105 at a specified doping level to turn the semiconductor layer 105 into a slightly n-type region.

This embodiment provides a structure in which the threshold voltages of the n- and p-channel thin-film transistors can be adjusted independently of each other.

Preferably, the workpiece is subjected to an annealing process by heat treatment or exposure to laser light after implanting the impurity ions into the semiconductor layer 104 and/or semiconductor layer 105 according to the fifth embodiment. The annealing is advantageous for activating the impurity ions and repairing damages caused by the implantation of the impurity ions.

Seventh Embodiment

A seventh embodiment of the invention is directed to a structure, in which offset gate regions are formed in addition to the low dopant concentration regions 122 and 124 (FIG. 2(B)) of the first embodiment.

Generally, the offset gate regions have such advantageous effects that they serve to prevent deterioration due to hot carriers, reduce off current, and practically decrease carrier mobility by increasing the resistance between source and drain. This means that the offset gate regions have the same effects as low dopant concentration regions, of which typical example is an LDD region.

FIGS. 6(A)–6(D) illustrate processing steps for the production of a thin-film transistor circuit having the CMOS structure of the seventh embodiment. Unless otherwise mentioned, the processing steps of this embodiment are basically same as those of the first embodiment which is illustrated in FIGS. 1(A)–1(E), 2(A)–2(D) and 3(A)–3(B). In addition, elements designated by the same reference numerals as used in FIGS. 1(A)–1(E), 2(A)–2(D) and 3(A)–3(B) are identical to those described in the first embodiment.

Figure 6A:
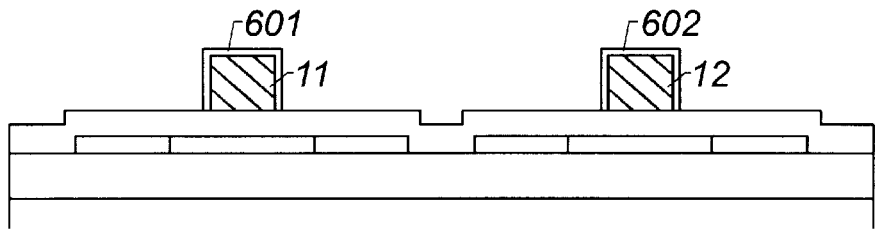
FIGS. 6(A)–6(D) are diagrams illustrating processing steps for the production of a thin-film transistor circuit having a CMOS structure according to a seventh embodiment.

What is characteristic of the seventh embodiment, in comparison with the first embodiment, is that anodic oxide films 601 and 602 having a fine and dense structure are formed to cover gate electrodes 11 and 12, respectively, at a greater thickness as shown in FIG. 6(A). Specifically, the anodic oxide films 601 and 602 are grown to a thickness of 2000 to 4000 Å. Although their thickness may be further increased, too high a voltage exceeding 300 V will be required in an anodic oxidization process, giving rise to problems concerning repeatability and operational safety.

These anodic oxide films 601 and 602 having the fine and dense structure are produced in basically the same way as described in the first embodiment except that the applied voltage is varied in accordance with the desired film thickness. Generally, the larger the film thickness, the higher the applied voltage.

Figure 6B:
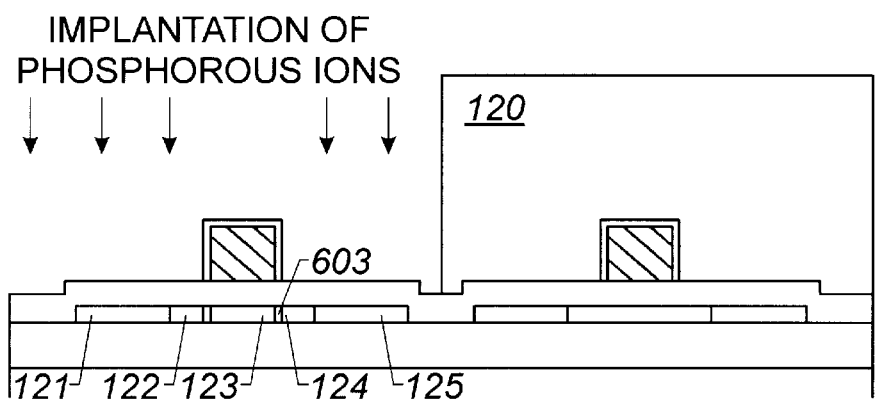

Subsequently, a resist mask 120 is formed to cover device elements that constitute a p-channel thin-film transistor, and phosphorus ions are implanted as shown in FIG. 6(B). The implantation of the phosphorus ions is performed at the same doping level as the first embodiment. As a result of this doping process, a source region 121, a drain region 125 and a channel region 123 are produced in a self-aligned manner. The doping process also produces low dopant concentration regions 122 and 124, of which the low dopant concentration region 124 serves as an LDD region.

In addition, a pair of offset gate regions 603 are formed on both sides of the channel region 123. These offset gate regions 603 do not act as source or drain regions. Approximate dimensions of the offset gate regions 603 are determined by the thickness of the fine anodic oxide film 601 formed on the surface of the gate electrode 11 in the process of FIG. 6(A).

Figure 6C:
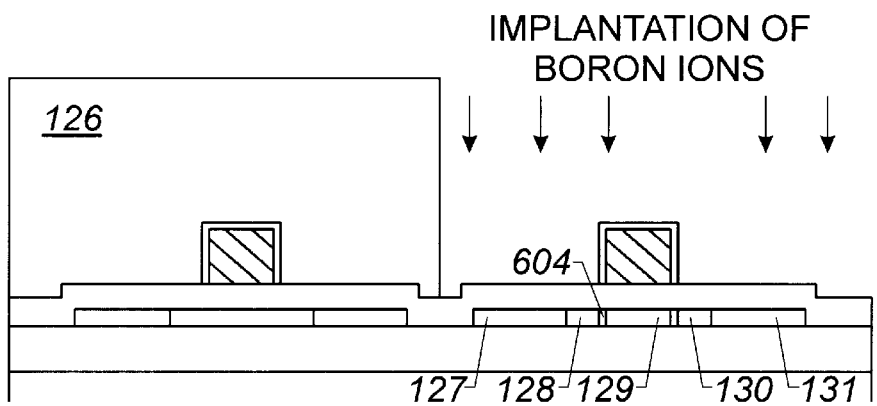

When the process shown in FIG. 6(B) has been completed, the resist mask 120 is removed and another resist mask 126 is formed to cover device elements that constitute an n-channel thin-film transistor. Then, boron ions are implanted as shown in FIG. 6(C) at the same doping level as the first embodiment. As a result of this doping process, a source region 128, a drain region 130 and a channel region 129 of the p-channel thin-film transistor are produced in a self-aligned manner. Contact pads 127 and 131 are also produced in this doping process. In addition, a pair of offset gate regions 604 having dimensions corresponding to the thickness of the anodic oxide film 602 are created as shown in FIG. 6(C).

Figure 6D:
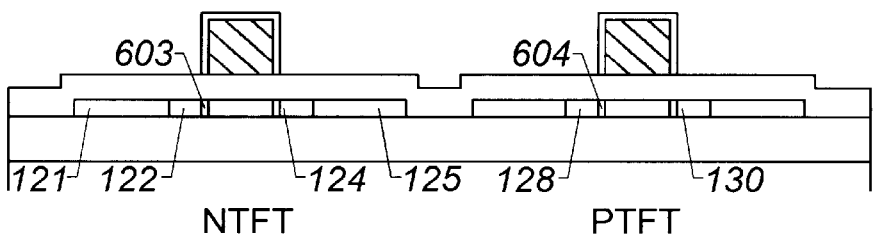

The resist mask 126 is now removed to obtain a structure shown in FIG. 6(D) and the workpiece is annealed by exposing its surface to laser light.

According to the CMOS structure of this embodiment, the n-channel thin-film transistor illustrated at left comprises a combination of the low dopant concentration regions 122 and 124 and the offset gate regions 603. The inventors have named such combination of the low dopant concentration regions and offset gate regions a high resistive drain (HRD) region. Although the p-channel thin-film transistor illustrated at right is not provided with any low dopant concentration regions, it comprises the offset gate regions 604.

If the thickness of the fine anodic oxide films 601 and 602 is made progressively smaller, effects of the offset gate regions 603 and 604 diminish accordingly, and a structure identical to the first embodiment will eventually be obtained.

There exists no distinct borderline, however, that defines a minimum thickness of the offset gate regions 603 and 604, or a minimum thickness of the anodic oxide films 601 and 602 required for forming regions operable as offset gate regions. It can be said, therefore, that offset gate regions exist between the source and channel regions and between the drain and channel regions in actuality even in the structure of the first embodiment although the effects of their presence might be negligible.

Eighth Embodiment

An eighth embodiment of the invention is directed to a structure, in which an active matrix area and a peripheral driver circuit for driving the active matrix area are integrally formed on a glass substrate.

Generally, one of substrates that form an integrated active matrix liquid crystal display is so constructed that at least one thin-film transistor for performing switching operation is located in each of a number of pixels which are arranged in a matrix form, and a peripheral circuit for driving an active matrix area is laid out on the periphery of the active matrix area. All these circuits are produced on a single glass (or quartz) substrate.

The present invention, if applied to such construction of the active matrix liquid crystal display, makes it possible to produce n-channel thin-film transistors having a low off current characteristic in the individual pixels and to configure the peripheral circuit with a CMOS circuit featuring high characteristics.

More particularly, the eighth embodiment provides a configuration in which the peripheral circuit has the CMOS structure depicted in FIGS. 1(A)–1(E), 2(A)–2(D) and 3(A)–3(B), and n-channel thin-film transistors having the same construction as shown in these Figures are laid out in the active matrix area.

Preferably, the thin-film transistors located in the active matrix area should have as low off current as possible because they are required to hold electric charges stored in the individual pixel electrodes within a specified period of time. The n-channel thin-film transistor provided with the low dopant concentration regions 122 and 124 shown at left in FIG. 3(B) is best suited to this purpose.

On the other hand, the CMOS circuit is often used for constructing a peripheral driver circuit. It is needed to achieve as favorable a balance as possible between electrical properties of n- and p-channel thin-film transistors that constitute the CMOS circuit for increasing its performance.

The CMOS structure of the first embodiment as described in FIGS. 1(A)–1(E), 2(A)–2(D) and 3(A)–3(B) is best suited to this purpose.

The aforementioned configuration of the eighth embodiment provides an integrated active matrix liquid crystal display comprising an n-channel thin-film transistor circuit in its active matrix area and a peripheral driver circuit, both circuits having desirable characteristics as described above.

Although the present embodiment employs the n-channel thin-film transistors having low dopant concentration regions (LDD regions) according to the foregoing discussion, it may be varied to employ such n-channel thin-film transistors that contain offset gate regions like the ones described in the second embodiment. Alternatively, n-channel thin-film transistors having HRD regions as described in the seventh embodiment may employed.

In another variation of the eighth embodiment, p-channel thin-film transistors may be laid out on the active matrix area, instead of the n-channel thin-film transistors. An advantage of this variation is that an image display area featuring increased reliability can be obtained because the p-channel thin-film transistors have higher resistance to deterioration.

Ninth Embodiment

As mentioned in the foregoing discussion of the first embodiment, a metallic element which accelerates crystallization may be utilized when crystallizing the amorphous silicon film. (Nickel is used as an example of metallic element in the following description of a ninth embodiment.) It is known, however, that a certain amount of nickel is left in a crystalline silicon film after the crystallization process.

If nickel is contained in an active layer exceeding a specific limit of concentration, there arises an adverse effect to electrical properties of a thin-film transistor. (A study carried out by the inventors indicates that this limit is $5 \times 10^{19}/cm^2$.)

The ninth embodiment provides a method for removing a metallic element remaining in a crystalline silicon film which constitutes a semiconductor layer of a thin-film transistor. The embodiment is now described in details with reference to FIGS. 7(A) to 7(E).

First, a substrate 701 having an insulative surface is prepared. The substrate 701 should have high thermal resistance. This is because the treatment temperature can occasionally exceed 1000° C. when producing a crystalline silicon film according to this embodiment.

In this embodiment, the substrate 701 is a quartz substrate, and a silicon oxide-nitride film 702 is formed as a buffer layer on top of the substrate 701 to a thickness of 3000 Å by the sputtering method.

Next, an amorphous silicon film 703 is grown to a thickness of 500 Å by the plasma CVD method or low-pressure thermal CVD method. Silane ($SiH_4$) or disilane ($Si_2H_6$), for instance, can be used as a film forming gas. The amorphous silicon film 703 formed by the low-pressure thermal CVD method is convenient for obtaining a larger grain size because it gives smaller probability of appearance of nuclei during a later crystallization process.

When the amorphous silicon film 703 has been formed, the workpiece is exposed to ultraviolet irradiation in an oxygen atmosphere in order to produce an extremely thin oxide layer (not shown) on the surface of the amorphous silicon film 703. This oxide layer causes the surface of the workpiece to exhibit enhanced wetting properties when nickel is introduced in a solution application process which will be described in the following (FIG. 7(A)).

Figure 7A:
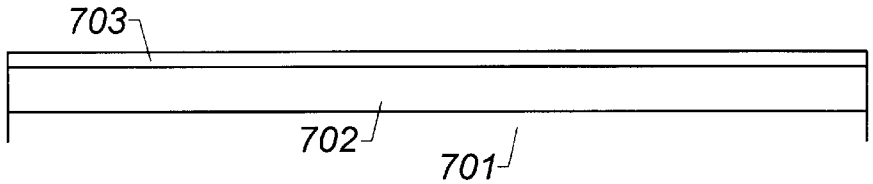
FIGS. 7(A)–7(E) are diagrams illustrating processing steps for forming semiconductor layers of thin-film transistors according to a ninth embodiment.
Figure 7B:
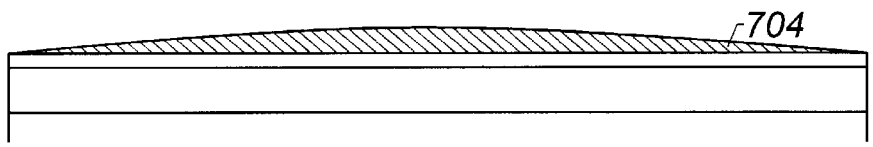

Next, a nickel salt solution containing nickel at a specified concentration is dropped onto the workpiece to form a water film 704 as shown in FIG. 7(B). It is preferable to use a nickel nitrate salt solution as the nickel salt solution if unwanted impurities that would remain after a later-described heating process are taken into account. Although a nickel acetate salt solution can also be used, it is not preferable because it contains carbon, and this is likely to produce carbides that remain in the silicon film after the later heating process.

In a condition shown in FIG. 7(B), the water film 704 is spread out evenly by use of a spinner so that nickel atoms contained in the water film 704 are held in direct contact with the unillustrated oxide layer formed on the amorphous silicon film 703.

Figure 7C:
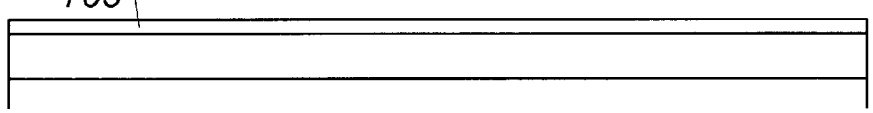

The workpiece is dehydrogenated for about an hour at 450° C. in an inert atmosphere, and then subjected to the heating process at a temperature of 500° to 700° C. (typically 550° to 600° C.) for a period of 1 to 24 hours in order to crystallize the amorphous silicon film 703. A crystalline silicon film 705 shown in FIG. 7(C) is obtained in this manner.

The nickel atoms which were initially held in direct contact with the unillustrated oxide layer covering the amorphous silicon film 703 diffuse into the amorphous silicon film 703 through the oxide layer and serve as a catalyst for accelerating crystallization. Specifically, nickel reacts with silicon to form a silicide, which then acts as nuclei around which crystallization takes place. The concentration of nickel injected during the above process can be easily controlled by adjusting the density of the nickel salt solution in the aforementioned solution application process.

Crystallinity of the crystalline silicon film 705 can be more improved by exposing the workpiece to a laser light or a light having an equivalent level of irradiation energy after the crystallization by the heating process has finished. With this after-treatment, small amorphous portions which still remain after the heating process can be completely crystallized.

Figure 7D:
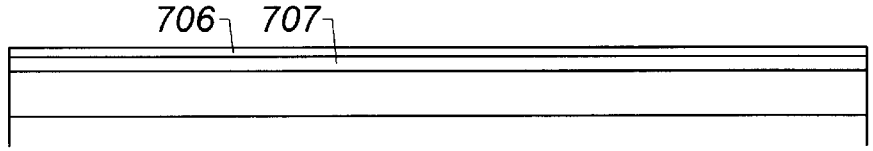

The crystalline silicon film 705 thus obtained is subjected to further heat treatment, which is performed at a higher temperature. Specifically, the temperature for this heating process is set within a range of 700° to 1200° C. (typically 800° to 1000° C.) and treatment time is set between 1 and 12 hours (typically 6 hours). It is important to use an atmosphere containing a halogen element (chlorine (Cl) in this embodiment) in the heating process as depicted in FIG. 7(D).

What is characteristic of the ninth embodiment is that nickel atoms remaining in the crystalline silicon film 705 are removed by carrying out the heating process in the atmosphere containing the halogen element. More particularly, this heating process is intended to absorb and fix the residual nickel atoms into a thermal oxide layer 706 that is formed on the crystalline silicon film 705 by using a gettering effect of the halogen element.

The atmosphere containing the halogen element used in this embodiment is prepared as follows. First, 10% by volume of oxygen is added to a nitrogen atmosphere, and then 3% by volume (relative to the volume of oxygen) of hydrochloric acid (HCl) is introduced. The heating process of FIG. 7(D) is performed in this atmosphere, typically at a temperature of 950° C. for a period of 6 hours. The reason why oxygen is added at such a low volume ratio is that the oxide layer 706 grows too rapidly if the ratio of oxygen is high, and this makes it difficult to obtain a sufficient gettering effect.

Although the element chlorine (Cl) is selected as the halogen element and is introduced in the form of hydrochloric acid (HCl) gas in this embodiment, other gases may be used for producing the atmosphere containing the halogen element. For example, one or more gases selected from hydrogen fluoride A), hydrogen bromide (HBr), chlorine ($Cl_2$), fluorine ($F_2$) and bromine ($Br_2$). Hydroxides of halogens are also usable for this purpose.

In any case, the nickel atoms remaining in the crystalline silicon film 705 are gettered into the thermal oxide layer 706 during the heating process illustrated in FIG. 7(D). As a result, the nickel atoms are removed from the crystalline silicon film 705 and a crystalline silicon film 707 containing almost no nickel atoms is obtained.

Crystal defects such as dislocations and stacking faults almost disappear and dangling bonds of silicon atoms are eliminated as recombination is achieved between such silicon atoms. This is because the above heating process is performed at a relatively high temperature (950° C.). Furthermore, still dangling bonds are terminated by hydrogen and halogen atoms contained in the crystalline silicon film 707. This means that the hydrogen and halogen elements are present in the crystalline silicon film 707.

When the process shown in FIG. 7(D) has finished, the thermal oxide layer 706 which served as a gettering site is removed. This is done for preventing the nickel atoms from diffusing back into the crystalline silicon film 707.

Figure 7E:
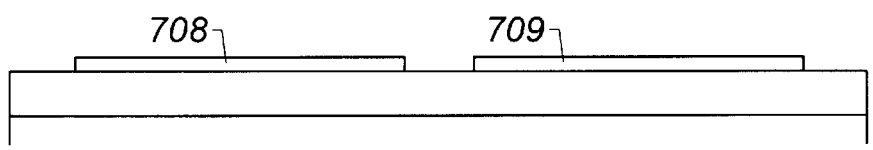

The crystalline silicon film 707 thus is patterned into islandlike form to form a semiconductor layer 708 of an n-channel thin-film transistor and a semiconductor layer 709 of a p-channel thin-film transistor as shown in FIG. 7(E).

The n- and p-channel thin-film transistors can be completed by following the same processing steps as described in the first embodiment thereafter.

Since the semiconductor layers 708 and 709 of the thin-film transistors produced according to the aforementioned processes of the ninth embodiment contain almost no metallic element (nickel in this embodiment), they are practically impervious to degradation caused by metallic elements or characteristic deterioration. In other words, this embodiment makes it possible to configure circuitry of an active matrix area and a peripheral driver circuit using the thin-film transistors featuring high reliability.

Tenth Embodiment

A tenth embodiment of the invention is directed to a method for further removing nickel atoms that can still remain in the above-described structure of the ninth embodiment.

In this embodiment, a crystalline silicon film obtained by a crystallization process using nickel is subjected to a heating process in an oxidizing atmosphere containing a halogen element to form a thermal oxide layer. Since this thermal oxide layer absorbs nickel atoms, it will eventually contain a higher concentration of nickel atoms than the crystalline silicon film.

The thermal oxide layer is removed when its formation has been completed. This operation serves to significantly reduce the concentration of nickel atoms remaining in the crystalline silicon film. The same effect can be obtained by using other metallic elements than nickel for accelerating crystallization of silicon.

The embodiment is now described more specifically by way of example, in which a thermal oxide layer is produced by heat-treating a crystalline silicon film obtained by the crystallization process using nickel in an oxygen atmosphere containing 3% by volume of hydrochloric acid (HCl).

The thickness of the thermal oxide layer should preferably be not less than 200 Å. This makes it possible to lessen the concentration of nickel atoms that remain in the crystalline silicon film.

Since unstable silicon components are consumed for the formation of the thermal oxide layer during heat treatment, defects in the crystalline silicon film can be reduced, and the quality of its crystal structure improved.

The invention, when embodied in semiconductor devices, will provide as advantageous effects as shown below:

(1) Changes in properties of a photoresist can be avoided as it is not required to implant impurities at an extremely high doping level in any processing step.

(2) Off current can be reduced by forming low dopant concentration regions only in n-channel thin-film transistors.

(3) Balance in electrical properties can be achieved between n- and p-channel thin-film transistors when configuring a CMOS structure by combining both types of thin-film transistors.

(4) It is easy to form a p-i junction and minimize damages to active layers because regions adjacent to a channel region are substantially intrinsic when implanting impurity ions for producing p-conductivity.

(5) Since the active layers are covered with such an insulating layer as a silicon oxide film, it is possible to avoid problems arising from contamination and surface damages which may otherwise occur when implanting impurity ions.

What is claimed is:

1. A semiconductor device comprising an n-channel thin film transistor and a p-channel thin film transistor, wherein
a first semiconductor island on an insulating surface, to form said n-channel thin film transistor having at least a first source region, a first drain region, and a first channel region therebetween, and a second semiconductor island on an insulating surface, to form said i-channel thin film transistor having at least a second source region, a second drain region, and a second channel region therebetween,
wherein only said n-channel thin film transistor in said first semiconductor island and not said i-channel transistor has a lightly-doped region;
wherein said p-channel thin film transistor further includes a pair of portions which are doped with both of n-type and p-type impurities in contact with said second source and second drain regions thereof; and
wherein said second source and second drain regions of said p-channel thin film transistor are doped with only the p-type impurity as an impurity for giving one conductivity type.

2. A semiconductor device having at least a p-channel thin film transistor and an n-channel thin film transistor, said device comprising:
at least a first and a second semiconductor island on an insulating surface;
an insulating layer covering said semiconductor islands;
a gate electrode over each of said semiconductor islands with said insulating layer therebetween, wherein
said first semiconductor island to form said n-channel thin film transistor comprises:
a first channel forming region under said gate electrode,
a pair of first offset regions adjacent to said first channel region, and
a first source and a first drain region adjacent to a pair of offset regions, and
said second semiconductor island to form said p-channel thin film transistor comprises:

a second channel forming region under said gate electrode, a pair of second offset regions adjacent to said second channel forming region, and a second source region and a second drain region adjacent to said second offset regions, said second source region and said second drain region comprising only a p-type impurity and directly contacting said second channel forming region, and a pair of portions adjacent to said second source region and said second drain region respectively, said pair of portions containing n- and p-type impurities, wherein said first offset regions have a longer width than said second offset regions.

3. A semiconductor device according to claim 1 or 2 wherein said second source region and said second drain region of said second semiconductor island to form said p-channel thin film transistor are individually interposed between one of said pair of the portions comprising n- and p-type impurities and said second channel forming region.

4. A semiconductor device according to claim 1 or 2 wherein said portions comprising n- and p-type impurities act only as connecting electrodes to said second source region and said second drain region.

5. A semiconductor device according to claim 1 or 2 wherein said first channel forming region comprises a p-type impurity and said second channel forming region comprises an n-type impurity.

6. A semiconductor device according to claim 1 or 2 further comprising:

an insulating film formed on side surfaces of said gate electrode of each of said n- and p-channel thin film transistors; and a pair of offset regions formed under said insulating film.

7. A semiconductor device according to claim 1 or 3 wherein said first and second semiconductor islands comprise hydrogen and a halogen element.

8. A semiconductor device comprising at least an n-channel thin film transistor in an active matrix area and at least an n- and p-channel thin film transistors with a complementary configuration in a peripheral driver circuit area, said transistors in said peripheral driver circuit area being for driving said transistors in said active matrix area, wherein each of said n-channel thin film transistors in an active matrix area and peripheral driver circuit comprises:

a first semiconductor island on an insulating surface;

an insulating layer covering said first semiconductor island;

a first gate electrode over said first semiconductor island with said insulating layer therebetween;

a first channel forming region under said first gate electrode, at least a pair of either lightly-doped regions or offset regions selectively formed adjacent to said first channel forming region, said pair of lightly-doped regions or offset regions containing an n-type impurity, and a first source region and a first drain region adjacent to said pair of lightly-doped regions or offset regions respectively, and each of said p-channel thin film transistors in said peripheral river circuit comprises:

a second semiconductor island on said insulating surface;

an insulating layer covering said second semiconductor island;

a second gate electrode over said second semiconductor island with said insulating layer therebetween;

a second channel forming region under said gate electrode, a second source region and a second drain region adjacent to said second channel forming region, said source region and said drain region containing only a p-type impurity and directly contacting said second channel forming region, and a pair of portions adjacent to said second source region and said second drain region respectively, said pair of portions containing n- and p-type impurities.

9. A semiconductor device comprising at least a p-channel thin film transistor in an active matrix area and at least an n- and p-channel thin film transistors with a complementary configuration in a peripheral driver circuit area, said transistors in said peripheral driver circuit area being for driving said transistors in said active matrix area, wherein each of said n-channel thin film transistors in peripheral driver circuit comprises:

a first semiconductor island on said insulating surface;

an insulating layer covering said first semiconductor island;

a first gate electrode over said first semiconductor island with said insulating layer therebetween;

a first channel forming region under said gate electrode, at least a pair of either lightly-doped regions or offset regions adjacent to said first channel forming region, said pair of lightly-doped regions or offset regions containing an n-type impurity, and a first source region and a first drain region adjacent to said pair of lightly-doped regions or offset regions respectively, and each of said p-channel thin film transistors in said active matrix area and said peripheral river circuit comprises:

a second semiconductor island on an insulating surface;

an insulating layer covering said second semiconductor island;

a second gate electrode over said semiconductor island with said insulating layer therebetween;

a second channel forming region under said gate electrode, a second source region and a second drain region adjacent to said channel region, said second source region and said second drain region containing only a p-type impurity and directly contacting said second channel forming region, and a pair of portions adjacent to said second source region and said second drain region respectively, said pair of portions having n- and p-type impurities.

10. A semiconductor device according to claim 8 or 9 wherein said second source region and said second drain region of said second semiconductor island are individually interposed between one of said pair of the portions containing n- and p-type impurities and said second channel forming region.

11. A semiconductor device according to claim 8 or 9 wherein said first channel forming region comprises a p-type impurity and said second channel forming region comprises an n-type impurity.

12. A semiconductor device according to claim 8 or 9 wherein said pair of first and second semiconductor islands comprises hydrogen and a halogen element.

* * * * *